(12) United States Patent
Reijnen et al.

(10) Patent No.: US 7,321,416 B2
(45) Date of Patent: Jan. 22, 2008

(54) LITHOGRAPHIC APPARATUS, DEVICE MANUFACTURING METHOD, DEVICE MANUFACTURED THEREBY, AND CONTROLLABLE PATTERNING DEVICE UTILIZING A SPATIAL LIGHT MODULATOR WITH DISTRIBUTED DIGITAL TO ANALOG CONVERSION

(75) Inventors: Martinus Cornelis Reijnen, Tilburg (NL); Andrej Makarovic, Veldhoven (NL); Lambertus Gerardus Maria Kessels, Aalst-Waalre (NL); Stoyan Nihtianov, Eindhoven (NL); Petrus Wilhelmus Josephus Maria Kemper, Waalre (NL); Kamen Hristov Chilov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 88 days.

(21) Appl. No.: 11/152,849

(22) Filed: Jun. 15, 2005

(65) Prior Publication Data

US 2006/0285094 A1    Dec. 21, 2006

(51) Int. Cl.
 *G03B 27/54* (2006.01)
 *G03B 27/42* (2006.01)
(52) U.S. Cl. .......................... 355/67; 355/53
(58) Field of Classification Search ............ 355/53, 355/67
 See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |

(Continued)

FOREIGN PATENT DOCUMENTS

EP    1 489 449 A1    12/2004

(Continued)

OTHER PUBLICATIONS

Search Report, dated Nov. 24, 2006, for European Patent Application No. 06252985.4, 9 pages.

*Primary Examiner*—Diane Lee
*Assistant Examiner*—Chia-how Michael Liu
(74) *Attorney, Agent, or Firm*—Sterne, Kessler, Goldstein & Fox PLLC

(57) ABSTRACT

The present invention comprises a lithographic apparatus and device manufacturing method method that uses a patterning device that increase a number of individually controllable elements that are programmed simultaneously to increase an update rate of an array of individually controllable elements. A number of required high speed analog inputs to the array is reduced. The complexity of the array is reduced and the maximum update speed of the array is increased. Furthermore, the number of elements within an array can be readily expanded. The patterning device can be divided into a plurality of groups of cells and the lithographic apparatus can comprise a plurality of supply channels. Each supply channel can be arranged to provide a voltage signal to each cell in a respective group of cells. This can reduce the number of required inputs to the patterning device for individually addressing each cell.

25 Claims, 9 Drawing Sheets

U.S. PATENT DOCUMENTS

| | | |
|---|---|---|
| 6,133,986 A | 10/2000 | Johnson |
| 6,177,980 B1 | 1/2001 | Johnson |
| 6,687,041 B1 | 2/2004 | Sandstrom |
| 6,741,384 B1 | 5/2004 | Martin et al. |
| 6,744,258 B2 * | 6/2004 | Ishio et al. ............ 324/548 |
| 6,747,783 B1 * | 6/2004 | Sandstrom ............ 359/290 |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 2002/0024714 A1 | 2/2002 | Sandstrom et al. |
| 2004/0041104 A1 | 3/2004 | Liebregts et al. |
| 2004/0130561 A1 | 7/2004 | Jain |
| 2004/0179257 A1 | 9/2004 | Gurcan |
| 2005/0007572 A1 | 1/2005 | George et al. |
| 2005/0024613 A1 | 2/2005 | Bleeker |

FOREIGN PATENT DOCUMENTS

| | | |
|---|---|---|
| WO | WO98/33096 | 7/1998 |
| WO | WO98/38597 | 9/1998 |

\* cited by examiner

LITHOGRAPHIC APPARATUS, DEVICE MANUFACTURING METHOD, DEVICE MANUFACTURED THEREBY, AND CONTROLLABLE PATTERNING DEVICE UTILIZING A SPATIAL LIGHT MODULATOR WITH DISTRIBUTED DIGITAL TO ANALOG CONVERSION

BACKGROUND

1. Field of the Present Invention

The present invention relates to a lithographic apparatus, a device manufacturing method, devices manufactured thereby, and to controllable patterning devices for patterning a beam of radiation.

2. Related Art

A lithographic apparatus is a machine that applies a desired pattern onto a target portion of a substrate. Lithographic apparatus can be used, for example, in the manufacture of integrated circuits (ICs), flat panel displays and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of, one or several dies) on a substrate (e.g., a silicon wafer or glass plate) that has a layer of radiation-sensitive material (resist).

Instead of a mask, the patterning means can comprise an array of individually controllable elements, which serve to generate the circuit pattern. The patterns to be produced on the target substrate can be generated in the digital domain, and it is then necessary to convert them into corresponding, accurately defined states of the individual elements. It is desirable to be able to update the states of the elements at high rates. Electrostatic force can be used to control the positions (i.e., the states) of the controllable elements. For example, movement can be achieved by application of a suitable control voltage to one or more control electrodes arranged next to a movable element. Other control techniques can be used. The translation of the desired pattern into appropriate element states can thus comprise the generation of a plurality of analog control voltages, each one corresponding to a respective element, from digital data. It is desirable to achieve this digital to analog conversion in a manner that enables the states of all elements in the controllable patterning device to be updated at a fast rate, with low power dissipation, with low complexity, high reliability, mechanical and electrical robustness, and in a cost-effective manner.

An array can contain a large number of elements, for example up to about 2.5 million individual elements, or an even larger number. If the element states (configurations) are updated in turn, by a sequential conversion of a corresponding plurality of digital values into analog control values, then this can cause problems if a high update rate for the patterning device as a whole is required.

The conversion of digital control signals (indicative of the desired element states) to analog control voltages can be performed by a DAC (Digital-to-Analog Converter) remote from the patterning device, the analog voltages then being supplied to the individual cells by means of one or more analog input channels. Each channel can be a transmission line, and owing to the relatively high voltages being applied to the transmission lines it may not be possible to terminate them characteristically.

Arrays of individually controllable elements can be thermally sensitive. One known off the shelf DAC and amplifier combination contains a 30 V, 1 GHz op-amp with a quiescent current of about 10 mA. This gives a power output of 300 W for 1000 channels. This quiescent power is dissipated largely as heat, which can cause the array of elements to malfunction if the DAC and driving amplifier combination is located close to the array to reduce the length of the transmission line or lines. ASIC designs are typically more efficient, but still dissipate a considerable amount of power.

Another problem with DAC circuits incorporating op-amps is that the feedback loop at high frequencies typically contains a significant series inductance (corresponding to the output impedance of the op-amp). Coupled with the input of each element, which can have a large capacitive element, this could result in a LC resonator tending to cause undesirable ringing. This could prolong the settling time for the voltage supplied to each element reducing the update rate for the array.

A term "write action" can be defined as the step or series of steps involved in supplying the appropriate control voltage for a single element. According to one possible update technique, the maximum required number of write actions for a column of elements in an array of cells is equal to the maximum number of different possible voltage values (assuming those cells requiring the same voltage are supplied with that voltage at the same time). Therefore, the time allowed for programming all the elements within a column must be long enough to allow for all possible analog voltage values. For an 8-bit system, up to 256 write actions are required.

The required speed of each analog input channel depends upon the number of elements each channel supplies and the update rate of the array. A lithographic apparatus for fabricating a flat panel display can have an update rate of about 50 kHz (giving about a 20 μs update period). The array of individually controllable elements can have about 100,000 macro pixels, each consisting of about 25 elements. Each macro pixel can be controlled as a single unit. Out of the about 20 μs update period, about 10 μs is required for the mechanical settling of each element. For accuracy, the analog voltage supplied to each element must be allowed sufficient time to settle to within about 0.4% of its correct value (for an eight bit digital signal). The settling time is dependent upon the output voltage span, the slew rate of the voltage output, the maximum output current and the capacitance of the load. For a typical op-amp having a voltage span of 25 V, about 100 ns settling time is needed for each analog voltage. To program all 100,000 macro pixels within 10 μs therefore would require about 1000 analog channels.

It is undesirable to have 1000 analog input channels due to the large number of required input connections to the array. This leads to increased expense in fabricating the array. Additionally, such a large number of inputs can lead to reliability issues, high power dissipation, an increase in the required board space and problems of cross talk interference between channels.

For certain lithographic processes, the number of elements that need to be individually controlled can be much greater, for example 2.5 million elements. In future this can increase to more than 10 million elements. Additionally the required update rate is likely to increase, thereby improving the throughput for the lithographic apparatus. It is clear that by persisting with the above techniques the number of required analog inputs would quickly become unmanageable.

Therefore what is needed is a system and method utilizing a patterning means that is more effective and more efficient.

SUMMARY

According to one embodiment of the present invention, there is provided a lithographic apparatus comprising: an illumination system for supplying a beam of radiation, a controllable patterning device comprising an array of individually controllable elements serving to impart the beam with a pattern in its cross-section, a control system arranged to control the patterning device, a substrate table for supporting a substrate, and a projection system for projecting the patterned beam onto a target portion of the substrate. The patterning device comprises a plurality of cells, each cell comprising a respective one of the individually controllable elements and a respective local control circuit controllable to generate a respective control voltage which determines the configuration of the respective controllable element. The control system is adapted to output a voltage signal. The apparatus further comprises a supply channel arranged to provide the voltage signal to each cell. The control system is further adapted to provide control signals to the plurality of local control circuits. Each local control circuit comprises a first respective controllable switching device, connecting the circuit to the supply channel, and a plurality of respective further electronic components and each local control circuit is responsive to the control signals to generate the respective control voltage from the voltage signal.

According to another embodiment of the present invention there is provided a device manufacturing method comprising the steps of: providing a substrate, providing a beam of radiation using an illumination system, using a controllable patterning device comprising an array of individually controllable elements to impart the beam with a pattern in its cross-section, and projecting the patterned beam of radiation onto a target portion of the substrate, wherein the patterning device comprises a plurality of cells, each cell comprising a respective one of the individually controllable elements and a respective local control circuit, controllable to generate a respective control voltage, which determines the configuration of the respective controllable element, each local control circuit comprising a first respective controllable switching device and a plurality of respective further electronic components. The method further comprises providing voltage signal to each cell, providing control signals to the plurality of local control circuits, and each local control circuit generating the respective control voltage from the voltage signal in response to the control signals.

According to another embodiment of the present invention there is provided a lithographic apparatus comprising: an illumination system for supplying a beam of radiation, a controllable patterning device comprising an array of individually controllable elements, serving to impart the beam with a pattern in its cross-section, a control system arranged to control the patterning device, a substrate table for supporting a substrate, and a projection system for projecting the patterned beam onto a target portion of the substrate. The control system is arranged to generate respective control voltages that determine the configuration of respective controllable elements. The control system comprises: a digital to analog converter arranged to sequentially receive a multiple bit digital signal corresponding to a desired control voltage, split the digital signal into at least two shorter digital signals and supply each shorter digital signal to a respective demultiplexer. Each demultiplexer is arranged to control a plurality of switches connected to a plurality of voltage input lines. The outputs of a first group of switches controlled by a first demultiplexer being scaled with respect to the outputs of the other set of switches, all of the outputs being connected together to form the control voltage, and the apparatus further comprising a channel arranged to supply each control voltage to each respective element.

According to yet another embodiment of the present invention there is provided a device manufacturing method comprising the steps of: providing a substrate, providing a beam of radiation using an illumination system, using a controllable patterning device comprising an array of individually controllable elements to impart the beam with a pattern in its cross-section, and projecting the patterned beam of radiation onto a target portion of the substrate, wherein a control system is arranged to generate respective control voltages, which determine the configuration of respective controllable elements. The method further comprises: the control system sequentially receiving multiple bit digital signals corresponding to the desired control voltages, splitting the digital signals into at least two shorter digital signals, supplying each shorter digital signal to a respective demultiplexer, each demultiplexer controlling a plurality of switches connected to a plurality of voltage input lines, the outputs of a first group of switches controlled by a first demultiplexer being scaled with respect to the outputs of the other set of switches, connecting all of the outputs together to form the control voltages, and supplying the control voltages to the array of individually controllable elements.

According to yet another embodiment of the present invention there is provided a lithographic apparatus comprising: an illumination system for supplying a beam of radiation, a controllable patterning device comprising an array of individually controllable elements serving to impart the beam with a pattern in its cross-section, a control system arranged to control the patterning device, a substrate table for supporting a substrate, and a projection system for projecting the patterned beam onto a target portion of the substrate. The patterning device comprises a plurality of cells, each cell comprising a respective one of the individually controllable elements and a respective DAC circuit. The control system is arranged to provide a respective digital signal to each DAC circuit, and each DAC circuit is arranged to generate a respective analog control voltage from the respective digital signal, the respective analog control voltage determining the configuration of the respective controllable element of the cell.

According to a still further embodiment of the present invention there is provided a device manufacturing method comprising the steps of: providing a substrate, providing a beam of radiation using an illumination system, using a controllable patterning device comprising an array of individually controllable elements to impart the beam with a pattern in its cross-section, and projecting the patterned beam of radiation onto a target portion of the substrate, wherein the patterning device comprises a plurality of cells, each cell comprising a respective one of the individually controllable elements and a respective DAC circuit. The method further comprises: providing a respective digital signal to each DAC circuit and using each DAC circuit to generate a respective analog control voltage from the respective digital signal. The respective analog control voltage determining the configuration of the respective controllable element of the cell.

According to yet a still further embodiment of the present invention there is provided a controllable patterning device comprising an array of individually controllable elements for imparting a pattern to the cross-section of a beam of radiation, wherein the patterning device comprises a plurality of cells, each cell comprising a respective one of the individually controllable elements and a respective DAC circuit, each DAC being adapted to receive a respective digital signal and to generate a respective analog control voltage from the respective digital signal, the respective analog control voltage determining the configuration of the respective controllable element of the cell.

According to yet a still further embodiment of the present invention there is provided a controllable patterning device comprising an array of individually controllable elements for imparting a pattern to the cross-section of a beam of radiation, wherein the patterning device comprises a plurality of cells, each cell comprising a respective one of the individually controllable elements and a respective local control circuit controllable to generate a respective control voltage which determines the configuration of the respective controllable element, each local control circuit comprising a first respective controllable switching device operable to connect the circuit to a supply channel to provide a voltage signal to each cell, and a plurality of respective further electronic components, each local control circuit being adapted to receive control signals and to generate the respective control voltage from the voltage signal.

According to another embodiment of the present invention there is provided a device manufactured using a method or apparatus in accordance with the above-mentioned embodiments.

According to another embodiment of the present invention there is provided a FPD (Flat Panel Display) manufactured using a method or apparatus in accordance with the above-mentioned embodiments.

According to a further embodiment of the present invention there is provided a controllable patterning device for use in a lithographic apparatus as described above.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
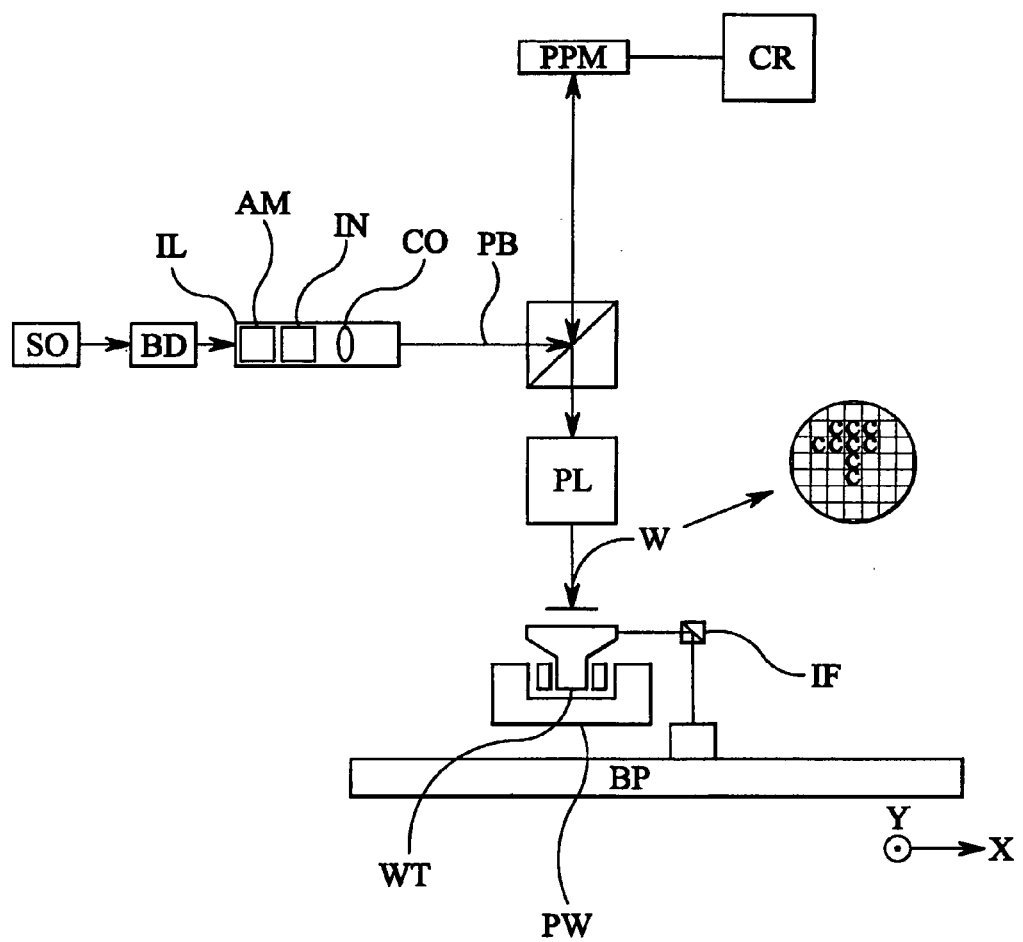
FIG. 1 depicts a lithographic apparatus, according to one embodiment of the present invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION

Overview

One or more embodiments of the present invention comprises providing a system or method that increase a number of elements that are programmed simultaneously to increase an update rate of the array. Additionally, the number of required high speed analog inputs to the array is reduced. The complexity of the array is reduced and the maximum update speed of the array is increased. Furthermore, the number of elements within an array can be readily expanded. In examples using a digital solution provided by certain embodiments of the present invention compared to analog solutions requires less power. This allows greater flexibility in fabricating the CMOS circuits local to each individually controllable element within the array.

In one example, the patterning device can be divided into a plurality of groups of cells and the lithographic apparatus comprises a plurality of supply channels. Each supply channel is arranged to provide a voltage signal to each cell in a respective group of cells. This reduces the number of required inputs to the patterning device for individually addressing each cell. Each control voltage can comprise an analog voltage value allowing for fine control of the configuration of the respective controllable element. The voltage signal can comprise a series of different voltages, and each local control circuit can comprise a respective integration circuit responsive to the control signals to generate the respective control voltage by integrating at least one selected respective voltage from the series. Each voltage within the series of different voltages can be equal to a full-scale voltage divided by a number less than or equal to the number of bits in a digital signal corresponding to a desired control voltage for each cell. This provides a large reduction in the number of write steps required to set the control voltage for each controllable element.

In one example, the control signals comprise a digital address input arranged to be high when the voltage signal is at a voltage level corresponding to a bit position in the digital signal for that cell which is high. This allows the desired control voltage for each cell to be built up from the required voltage steps in the series of different voltages.

In one example, a plurality of respective electronic components comprises: a first capacitor having first and second terminals, an operational amplifier having first and second inputs and an output, the second input being connected to ground, a second capacitor connected between the first input and the output of the operational amplifier, and a second controllable switching device having a select position in which the second terminal of the first capacitor is connected to ground and a deselect position in which the second terminal of the first capacitor is connected to the first input of the operational amplifier. The first controllable switching device has a select position in which the first terminal of the first capacitor is connected to the voltage signal and a deselect position in which the first terminal of the first capacitor is connected to ground. Each local control circuit is arranged, such that the operation of the first and second controllable switching devices is controlled by the digital address input so that: when the digital address input is high the controllable switching devices are in the select position and the first capacitor is charged to the voltage of the voltage signal, when the digital address input is low the controllable switching devices are in the deselect position and the charge stored on the first capacitor is transferred to the second capacitor, and after each series of different voltages of the voltage signal the voltage on the output of the charge amplifier comprises the control voltage for the respective controllable element.

In one example, each local control circuit further comprises a third controllable switching device arranged electrically in parallel to the second capacitor controlled by a reset signal. Closing the third controllable switching device when the first and second controllable switching devices are in the deselect position substantially erases any charge stored on the capacitors, such that the control voltage is substantially reduced to zero volts. This allows the control voltages for each controllable element to be erased before the array of elements is programmed with the new control voltages.

In one example, each local control circuit further comprises: a third capacitor having a first terminal and a second terminal connected to ground; and a fourth controllable switching device connected between the output of the operational amplifier and the first terminal of the third capacitor; wherein the fourth controllable switching device can be selectively closed to charge the third capacitor to the output voltage of the operational amplifier, the voltage across the third capacitor comprising the control voltage for the respective controllable element for that cell. This reduces unnecessary variation in the control voltage being applied to the controllable element during each programming cycle. The third capacitor can comprise the input capacitance of the respective controllable element.

Alternatively, the control signals can comprise a digital address input and a digital signal corresponding to a desired control voltage for each cell, each local control circuit being arranged to receive its respective digital signal in response to the digital address input. This alternative embodiment of the present invention allows for a purely digital solution to programming each controllable element with the required control voltage. In the purely digital solution the local control circuit operates at a low voltage, for example about 1.8 v. Consequently, the amount of power dissipated by the control circuit is minimal. This reduces the amount of heat generated in the controllable patterning device.

In one example, the first respective controllable switching device can be connected between the supply channel and ground via a fourth capacitor, the first respective controllable switching device being controlled by an intermediate control signal and the voltage across the fourth capacitor comprises the control voltage for the respective controllable element. The fourth capacitor can comprise the input capacitance of the respective controllable element.

In one example, the voltage signal can comprise a voltage whose magnitude is arranged to change progressively over a predetermined time period, and each local control circuit is responsive to the control signals to determine the respective control voltage by controlling a timing of operation of the respective first controllable switching device during the period. This provides for a simple solution for substantially simultaneously programming the control voltage for a large number of controllable elements, which is done by separately tapping a common time variant input signal at the appropriate time for each controllable element. The plurality of respective further electronic components can comprise a down counter arranged to receive the digital signal, wait a period of time proportional to the value of the digital signal from the start of the predetermined time period, and open the first controllable switching device.

In one example, the first controllable switching device can be closed from the start of the predetermined time period. This approach allows a long period of time for the fourth capacitor to charge up to the level of the voltage signal. Alternatively, the first controllable switching device can be arranged to close shortly before it is reopened. In the latter the voltage across the fourth capacitor does not vary as much during each programming cycle.

Alternatively, the voltage signal can comprise a voltage of substantially constant magnitude, each local control circuit comprises a respective PWM signal generator arranged to control the first respective controllable switching device, and the control signals from the control system are arranged to determine the duty cycle of each PWM control signal. This provides for fine control of the control voltage supplied to each controllable element, from a single voltage signal.

In certain embodiments of the present invention, the voltage signal can comprise a series of different voltages, and each local control circuit comprises a respective integration circuit. Generating the respective control voltage can be done by integrating at least one selected respective voltage from the series in response to the control signals.

Alternatively, the voltage signal can comprise a voltage whose magnitude is arranged to change progressively over a predetermined time period. Determining the respective control voltage can be done by controlling a timing of operation of the respective first controllable switching device in response to the control signals during the period.

In one example, the voltage signal comprises a voltage of substantially constant magnitude, each local control circuit comprises a respective PWM signal generator arranged to control the respective first controllable switching device. Determining the duty cycle of each PWM control signal can be done in response to the control signals from the control system.

In various examples and embodiments, the DAC dissipates less power than known DACs. This allows it to be fabricated much closer to the array without risking malfunction due to overheating. A smaller volume per channel is required. Both of these aspects are at least in part due to not requiring buffer amplifiers.

In one example, each switch can be connected to its respective voltage input line via a resistor, the resistors connected to the first group of switches being larger than the resistors connected to the other set of switches.

Exemplary Systems and Methods

FIG. 1 schematically depicts the lithographic apparatus of one embodiment of the invention. The apparatus comprises an illumination system IL, a patterning device PD, a substrate table WT, a controller CR, and a projection system PS.

The illumination system (illuminator) IL is configured to condition a radiation beam B (e.g., UV radiation).

The patterning device PD (e.g., an array of individually controllable elements) modulates the projection beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device," used herein should be broadly interpreted as referring to any device that can be used to modulate the cross-section of a radiation beam, such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means. More information on mirror arrays as here referred to can be gleaned, for example, from United States Patents U.S. Pat. No. 5,296,891 and U.S. Pat. No. 5,523,193, and PCT patent applications WO 98/38597 and WO 98/33096, which are incorporated herein by reference in their entirety.

Another example PD is a programmable LCD array. An example of such a construction is given in United States Patent U.S. Pat. No. 5,229,872, which is incorporated herein by reference in its entirety.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

In example where the substrate has a substantially circular shape include examples where the substrate has a diameter of at least 25 mm, for example at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for example a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 µm, e.g., at least 100 µm, at least 200 µm, at least 300 µm, at least 400 µm, at least 500 µm, or at least 600 µm. In one example, the thickness of the substrate is at most 5000 µm, e.g., at most 3500 cm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

As herein depicted in FIG. 1, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least Onmn, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In one example, the apparatus is absent at least a short stroke module for moving substrate table WT. A similar system can also be used to position the array of individually controllable elements. It will be appreciated that the projection beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the projection beam B is caused to scan a line across the substrate W. The pattern on the array of individually controllable elements is updated as required between pulses of the radiation system and the pulses are timed such that successive target portions C are exposed at the required locations on the substrate W. Consequently, the projection beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the projection beam B scans across the substrate W and exposes it. A substantially constant radiation source or a pulsed radiation source, synchronized to the updating of the pattern on the array of individually controllable elements, can be used.

5. In pixel grid imaging mode, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In accordance with one embodiment of the present invention, there is provided a controller CR for supplying the array of individually controllable elements with analog voltage values to control each element. The controller CR is supplied with a digital control signal representing a desired analog element control signal voltage for every element (or group of elements) within the array.

In one example, controller CR can be considered to be a form of distributed digital to analog converter (DAC). By distributing the DAC the amount of analog data that has to be transferred to the array is reduced.

Figure 2:
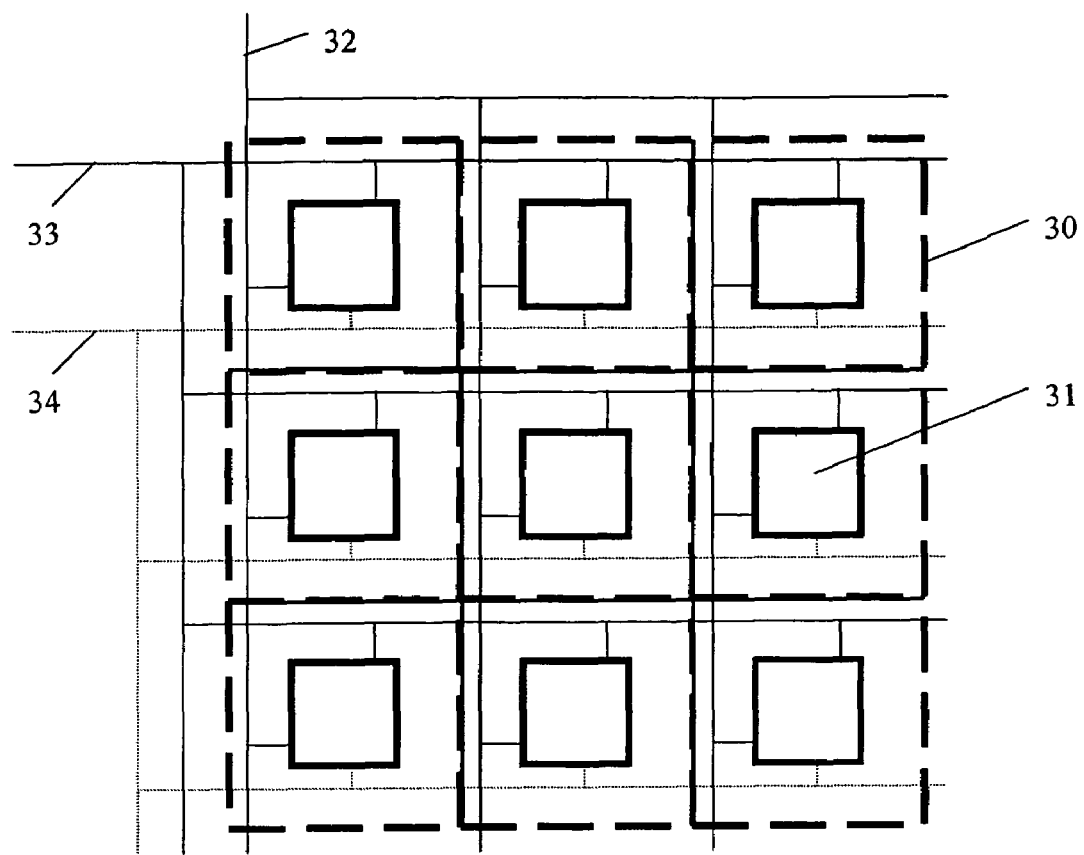
FIG. 2 depicts a distributed digital to analog converter, according to one embodiment of the present invention.

FIG. 2 illustrates a schematic representation of a distributed DAC, in accordance with one embodiment of the present invention. Each element (not shown) within the array of individually controllable array forms part of a cell 30, in combination with associated a local control circuit 31. Each control circuit 31 provides the element control signal to the associated element.

FIG. 2 shows a 3×3 array of cells, although it will be appreciated that the array can be much larger. Each cell 30 within the array has a first input signal 32, which comprises an analog input. This analog input 32 can be either supplied to every cell within the array, or there can be a small number of inputs 32, each serving a column or block of cells 30. In various examples, the analog input 32 can be either a DC voltage supply or it can be a time varying voltage signal, either varying continuously or in discrete steps.

The analog input 32 can be supplied from a remote location. Alternatively, it can be generated in a circuit located on the array close to the cells. Each cell 30 also has a second input 33, which comprises an address input. The address input 33 can in fact be multiple address input lines, depending on the particular embodiment of the present invention. The address input 33 supplies digital address information, which is used by the local control circuit 31 to derive the element control signal for the associated element from the analog input 32. Dependent upon the particular embodiment of the present invention, there can be one or more further inputs to each cell 30 (shown generically as input 34). These further inputs can for example be a reset input, further digital control inputs or any other type.

In one example, the controller CR is split into two parts: a single bit reference analog voltage generator and an array of charge collectors. Each element within the array of individually controllable elements has an associated charge collector, which comprises the local control circuit 31. The charge collector is implemented directly adjacent to, or behind, each element.

In one example, the bit reference generator generates, in turn, a reference analog voltage corresponding to each possible bit value within the digital signal representing the required analog element control signal for each element. Each bit reference analog voltage is a fraction of the maximum possible (full-scale) voltage. For example, for an 8-bit system the desired configuration of each element within the array is represented by an 8-bit number. The bit reference analog voltage is full-scale/2 for the most significant bit (MSB) and full-scale/256 for the least significant bit (LSB). It can be seen that by adding together the bit reference analog voltages for the desired bits (e.g., those represented by a 1 for the digital signal representing the required analog voltage for each element), then any one of 256 analog voltages varying between 0 volts and the full-scalex255/256 volts can be achieved. The possible analog voltages increase in regular increments of full-scale/256 volts. The bit reference generator supplies each bit reference analog voltage in turn to all the cells in one column/block of columns (or alternatively to the charge collectors for the entire array).

In one example, each charge collector is arranged to receive the bit reference analog voltage for each bit given the value 1 in the digital signal for the element associated with that charge collector. Whether or not a charge collector receives each supplied bit reference analog voltage is dependent upon a controlling digital address signal supplied to the charge collector (corresponding to address input 33). For an array of cells arranged into columns each charge collector has two digital address inputs corresponding to the column and row number. To program the cells within a column the column address input for that column is set high. For each supplied bit reference voltage, if that cell requires that bit reference voltage, then the row address input corresponding to that charge collector is set high. By a combination of column and line address inputs each charge collector within a column can be individually addressed. For each column or block of columns the cells are updated simultaneously for each bit. Therefore, to program every cell within a column/block of columns with the appropriate analog voltage takes eight cycles for an 8-bit system.

FIG. 2 is also representative a controllable patterning device, according to one embodiment of the present invention. The controllable patterning device comprises an array of cells 30, each cell including one or more respective controllable elements and a respective local DAC circuit 31. A respective digital control signal 34 is supplied to each cell and is then converted by the DAC 31 into a corresponding analog control voltage, which the cell uses to determine (i.e., set) the state of its respective controllable element. Each DAC can be supplied with an analog reference voltage via a channel 32, in addition to its digital signal (indicative of the desired element state) via supply line 34.

Figure 3:
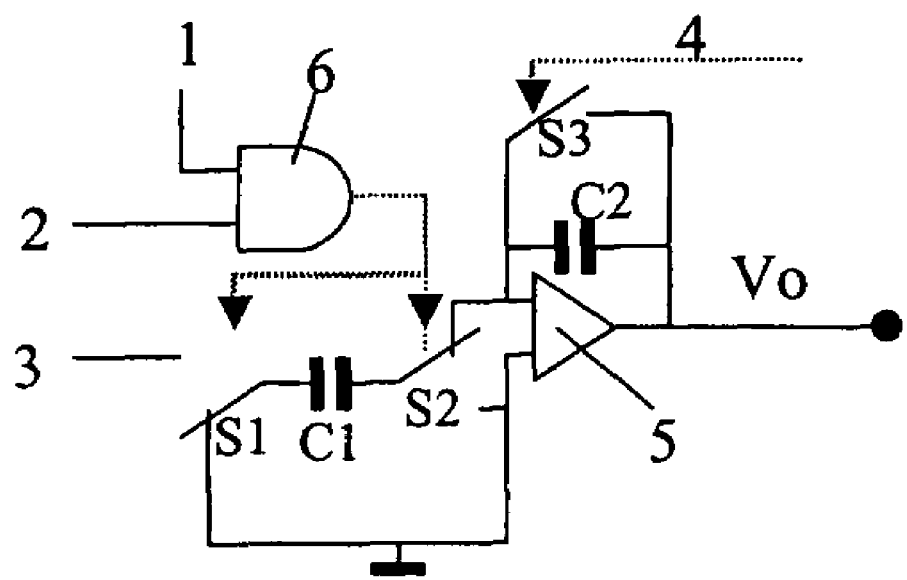
FIG. 3 depicts a charge collector circuit, according to one embodiment of the present invention.

FIG. 3 shows an implementation of a charge collector, in accordance with one embodiment of the present invention. The charge collector is controlled by four inputs: two address inputs 1, 2, corresponding to a column select input and a row select input respectively, an input for the bit reference analog voltage 3 and a reset input 4. The bit reference analog input 3 and the reset input 4 are common to all charge collectors within the column. They can also be common to all the charge collectors within the array.

In one example, programming each cell within a column with the voltage equivalent to a single bit there is a write cycle consisting of three distinct steps: (a) Set the bit reference analog voltage to the required voltage level; (b) Select within the current column all cells requiring the corresponding bit; and (c) deselect all cells.

In one example, to program all the cells in a column (or in a group of columns/the entire array) with the analog voltage corresponding to the whole digital signal there is a programming cycle comprising a number of write cycles equal to the number of bits in the digital signal representing the desired analog element control signal for each element.

In one example, at the start of the programming cycle for the first bit, the output voltage Vo supplied to the element associated with that charge collector is set to zero volts. The charge on capacitors C1 and C2 is zero volts. In the first step of the write cycle the bit reference voltage generator sets the voltage on the bit reference analog voltage input 3 to the required value for the first bit. This can be the MSB or the write cycle can start with any arbitrary bit. For an 8-bit system the bit reference analog voltage supplied corresponding to each bit in a digital signal can be calculated as shown in Table 1.

TABLE 1

| Bit | Value | Example for 10 V full-scale reference voltage (V) |
| --- | --- | --- |
| MSB | Full-scale/2 | 5 V |
| 2nd bit | Full-scale/4 | 2.5 V |
| 3rd bit | Full-scale/8 | 1.25 V |
| 4th bit | Full-scale/16 | 625 mV |
| 5th bit | Full-scale/32 | 312.5 mV |
| 6th bit | Full-scale/64 | 156.25 mV |
| 7th bit | Full-scale/128 | 78.125 mV |
| LSB | Full-scale/256 | 39.0625 mV |

In step one, all the charge selectors for the current column are deselected, i.e., switches S1 and S2 are in the positions shown in FIG. 3. S1 is connected to ground, and the bit reference voltage input 3 is not connected to the charge collector. S2 is connected to a charge amplifier 5. The bit reference voltage for the current bit is supplied to the bit reference voltage input 3 by an external circuit (not shown).

In step two, those cells within the current column that require the bit reference voltage for that bit are selected via digital address inputs 1 and 2. Column address input 1 will be set high for the entire column. Line address input 2 will be set high for the cells requiring the current bit reference voltage. AND gate 6 provides an output that is high if both inputs are high. The output of AND gate 6 controls the position of switches S1 and S2. When the output of AND gate 6 is high switch S2 switches to ground and S1 switches to the bit reference voltage input 3. Therefore, capacitor C2 is connected between the bit reference input 3 and ground, and is charged up to the voltage on input 3.

In step 3, all cells of the current column are deselected, most simply by setting the column address input 1 low. Alternatively, all line address inputs 2 can be set low. Switches S1 and S2 revert to their original positions. Capacitor C1 is now connected between ground and one of the inputs to charge amplifier 5. Charge amplifier 5 acts to alter its output voltage until there is no differential voltage between the inputs to the charge amplifier 5, thereby transferring the charge on capacitor C1 to capacitor C2. The output voltage at charge amplifier 5 will rise to:

$Vo = C_2/C_1 \times Vb$ (where $Vb$ is the bit reference voltage).

For programming the next bit in the programming cycle, a new write cycle starts at step one and the next bit reference analog voltage is set on input 3 while all the cells remain deselected. Again all cells are selected where this bit reference is required. When the cells are deselected any charge on capacitor C1 is transferred to C2 for each charge collector. This has the effect of increasing the output voltage Vo by a further amount dependent upon the current value of the bit reference voltage. This is added to any voltage present at the output from previous write cycles. In this manner, the output voltage Vo is built up sequentially for each bit of the digital signal for each element. This continues until the required element control signal for each element in a column has been built up by the associated charge collector. This analog voltage controls the configuration of the element, and typically will be held constant for a predetermined period after the programming cycle is complete.

Before each cell can be programmed with a new analog voltage, all cells must be reset such that the output voltage Vo of the charge collector is returned to zero volts. This is achieved by triggering the reset input 4 connected to each charge collector in that column at the required time. This is done when all cells within the column are deselected (i.e., switches S1 and S2 are in the positions shown in FIG. 3). The reset input 4 closes switch S3. Closing switch S3 short-circuits capacitor C2, such that the output voltage Vo is applied to one of the inputs to the charge amplifier 5. The charge amplifier acts to reduce the output voltage Vo until there is no differential voltage between the two inputs to the charge amplifier 5. The output voltage Vo reduces to zero volts. Any charge stored on capacitor C1 is removed.

During step 3 of the write cycle (deselect all cells within the column), the analog bit reference voltage is still set to the previous value and applied to input 3. This can then be used to program the cells in another column, i.e., by selecting those cells in the second column that require the current bit reference voltage at the same time as deselecting all of the cells in the first column. In this way the write cycles for two columns can be partially overlapped, resulting in a reduction in the time taken to program all cells within an array. Effectively, step 1 of the write cycle is shared by all columns for each bit of the programming cycle, and each column only requires steps 1 and 2 for the current bit.

Figure 4:
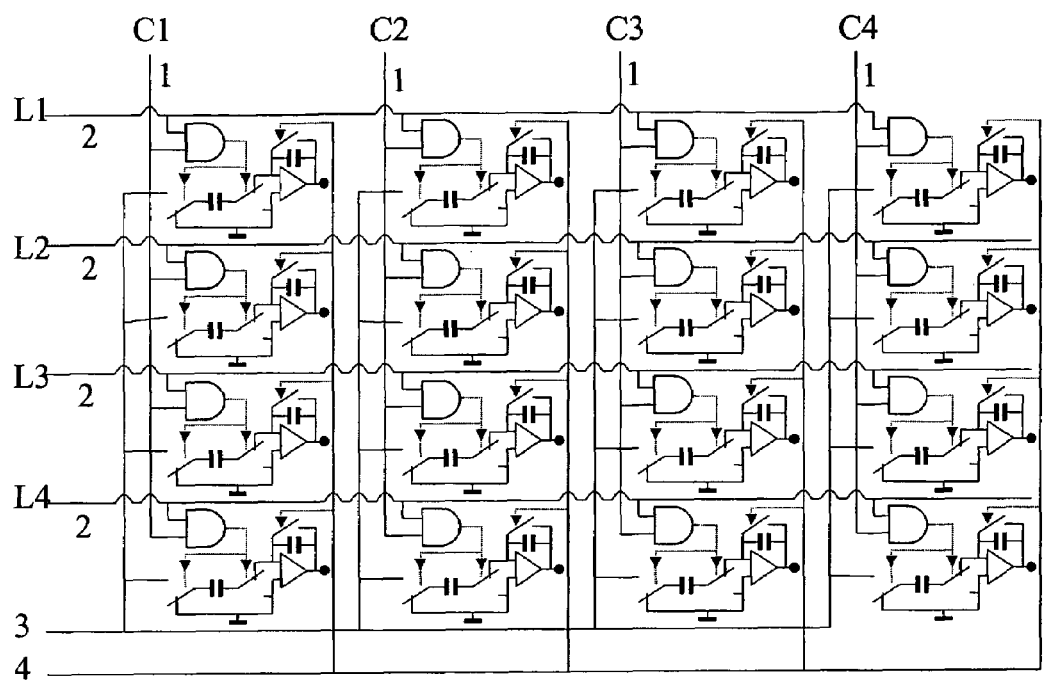
FIG. 4 depicts an array of charge collector circuits, according to one embodiment of the present invention.

FIG. 4 shows a schematic representation of several charge collectors in a array, according to one embodiment of the present invention. In FIG. 4, only 16 charge collectors (a 4×4 array) are shown, however, it will be appreciated that this could easily be scaled up or down. Each charge collector is as shown in FIG. 3. Column address inputs 1 are individually labeled C1–C4 respectively. Line address inputs are labeled L1–L4 respectively.

In one example, tn order to program an entire array the programming cycle is as follows. The entire array is reset by applying the reset input 4, while the charge collectors are in the deselect state as shown. A pulse (which can be positive or negative) is applied to reset input 4 for a short period. This ensures that the output Vo for each charge collector is at zero volts as described above and that there is substantially no charge stored on the capacitors. Next, the bit reference analog voltage for the first bit is set on input 3. Column C1 is selected by applying a select voltage to input C1. It will be appreciated that the select voltage applied to each column or line input can be positive or negative. Each cell within column C1 where the first bit is required to be set is selected by applying the appropriate input to the associated line input. Column C1 is then deselected, either by reversing the voltage on the line input for each previously selected cell, or by reversing the column input voltage on C1. At the same time another column, for example C2, could be selected. The write cycle then continues for that column. Once the current bit reference analog voltage has been applied to the appropriate cells across the whole array all cells are deselected and the bit reference analog voltage for the next bit is applied to the input 3. This process continues until every cell has been programmed with all bits across the array.

In one example, the number of write actions required to program the analog voltage at the output Vo of each charge collector, for an N-bit digital signal, can be calculated as follows:

Number of write actions=Number of bits×Number of columns+1 (for reset)+Number of bits (for setting the bit reference analog voltage)

$W = B \times C + 1 + B$

The selecting phase takes one clock cycle per column per bit. The deselecting phase takes one clock cycle per bit. The reset phase takes one clock cycle for the entire array.

The number of write actions required to program an entire array could be reduced by increasing the number of lines per column (and thereby reducing the number of columns). Alternatively, more or even all the columns could be programmed at once. However, the consequence of all of these options is to increase the number of digital address inputs required to be able to individually address every cell. This would involve an increase in the complexity of the addressing. To halve the number of write actions by updating two columns simultaneously would double the number of required address lines.

In one example, in order to further reduce the number of write actions in a programming cycle, the analog bit reference voltage can be set while the cells in the last column are deselected using the previous bit reference voltage. The first bit reference analog voltage in a programming cycle can be set during the reset operation for the last bit in the previous programming cycle. This saves a number of write actions equal to the number of bits being programmed, i.e., the number of write actions is now: $W = B \times C + 1$ Each time the bit reference voltage supplied to input 3 is changed it takes a finite amount of time for the voltage to settle. This can increase the time taken in each programming cycle. In one example, the time available for the bit reference voltage to settle can be increased by dividing the array into two or more parts. Each part of the array has a separate bit reference voltage input 3 and is programmed separately. Each bit reference voltage input is updated when the last column in the respective part of the array is deselected. The number of columns in each part of the array is reduced. Therefore, the number of write actions required to update each part of the array is reduced. Consequently, the time available to update the bit reference voltage is increased.

Figure 5:
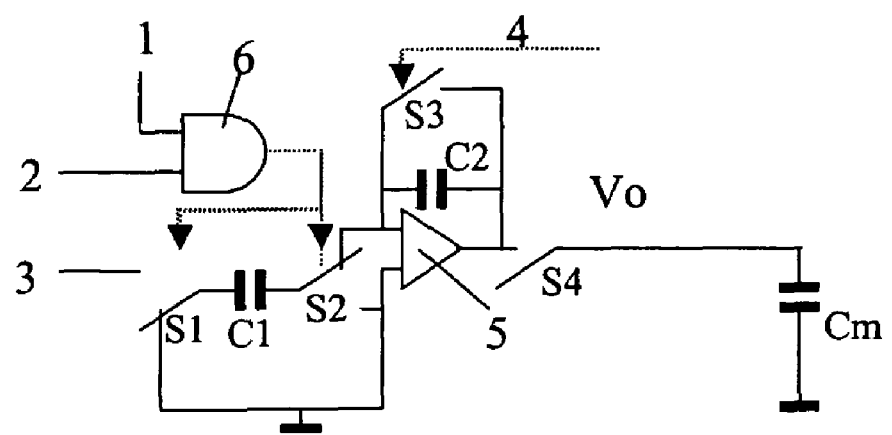
FIG. 5 depicts the charge collector circuit of FIG. 3, in combination with a sample and hold circuit, according to one embodiment of the present invention.

FIG. 5 schematically illustrates a modification of the charge collector depicted in FIG. 3, according to one embodiment of the present invention. For certain types of elements it is undesirable for the analog element control signal to vary during updating of the next element control signal. This can be particularly undesirable for a MEMS mirror type element. Unnecessary variation in the element control signal can cause increased wear to the hinge element of the mirror. In an exemplary programming cycle as described above, for an element at which the element control signal does not change from one programming cycle to the next, will nevertheless result in the Vo (equivalent to the element control signal) being reduced to zero volts and then back to the same voltage level. The circuit of FIG. 5 alleviates this problem by introducing a sample and hold circuit between the output Vo of the charge collector and the element.

In one example, the sample and hold circuit comprises switch S4 and capacitor Cm. Cm represents the capacitance of each individually controllable element, for example the mirror capacitance of an SLM mirror array. Once the analog voltage output Vo has stabilized at the end of a complete programming cycle switch S4 is closed. Capacitor Cm is charged to the output voltage of the charge collector Vo. Switch S4 is then opened, disconnecting capacitor Cm from the charge collector. Consequently, the element control signal supplied to the element does not vary during the next programming cycle until Vo reaches its final value. As long as the time between successive reprogramming cycles is short enough to prevent significant capacitor discharge of capacitor Cm the voltage supplied to the element will not vary until the next time switch S4 is closed. It is necessary to ensure that the sampling takes place before the reset operation. It can be necessary to use another clock cycle for this, in which case the number of write actions in a programming cycle is: W=B×C+2

A sample and hold circuit as illustrate in FIG. 5 can be applied to any local control circuit, in accordance with one embodiment of the present invention. In one example, it allows the control voltage for each cell to be updated, while the associated individually controllable element is set to the state for the previous control voltage. This means that for a typical FPD application, for example, the complete reprogramming cycle time of 20 µs is available for updating the control voltage, by overlapping this update with the settling time for the controllable element.

A further modification to optimize the programming cycle in accordance with one embodiment of the present invention is to implement a charge amplifier with a non-linear response. The position sensitivity of an element within an array typically has an approximately quadratic response for the element control signal. Consequently, for a high applied voltage the required resolution is less. For a charge amplifier (and therefore a charge collector) with a quadratic response the number of required bits can be reduced.

In accordance with an alternative embodiment of the present invention, each element within the array is updated from a single analog input 32. This input carries a continuously varying, or finely graded discrete signal, which covers the whole of the required voltage range. The input ramps up through the required range within the time available for updating the analog voltage at each cell. The input can be an analog voltage derived external to the array. This input voltage can be a triangular or a saw tooth waveform.

Figure 6:
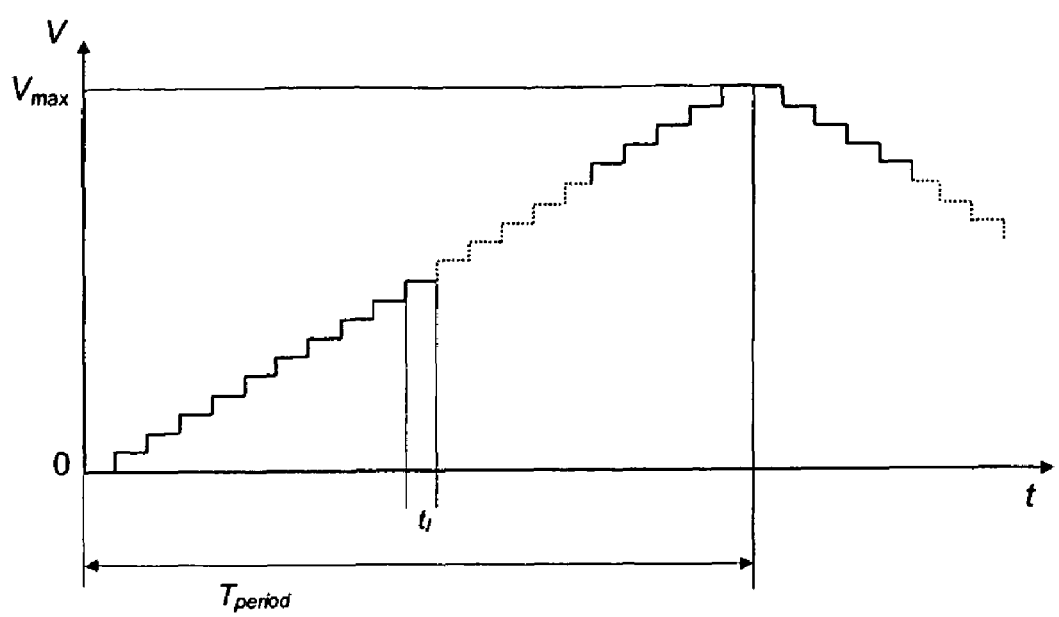
FIG. 6 depicts principle of element reprogramming using a single ramped voltage source, according to one embodiment of the present invention.

FIG. 6 depicts a low power CMOS digital to analog converter with a voltage output synchronized to the array's internal clock, according to one embodiment of the present invention. This DAC can be implemented local to the array or can be an external input. $T_{period}$ is the time allowed for updating the analog voltage for each element. $V_{max}$ is the maximum voltage that could be applied to an element. In this figure, $t_1$ is the time within which the right voltage level has to be stored on the hold capacitance for each element within the array. The voltage is stored by closing an analog switch connected between the input voltage and the hold capacitance, charging the hold capacitance and opening the switch again all within the time for which the input voltage is within one least significant bit of the correct input voltage. For an input voltage varying between zero volts and the maximum voltage during a reprogramming time of about 10 µs (typical for a flat panel display apparatus) having an 8-bit digital signal for each element this means that the available time $t_1$ for charging the hold capacitance is about 10 µs/256=39 ns. In one example, for an optical lithographic apparatus having an available reprogramming time of about 240 µs, $t_1$ is about 240 µs/256=938 ns.

In one example, the smaller the time available for charging the hold capacitance the more severe are the requirements for synchronizing the analog switch, propagation delays (for controlling the switch), and charging time constants for the hold capacitance. This can be partially overcome by closing all switches when the analog voltage input begins to rise from 0 V and opening each switch once the input voltage has reached the required voltage. This allows more time for charging the hold capacitance, allowing the charging time constant to be higher. This will allow the use of switches with higher values for the on resistance and higher ohmic signal lines. There may be undesirable side effects of the voltage supplied to the individually controllable element varying unnecessarily throughout each programming cycle, which can be avoided by providing the circuit with a sample and hold circuit. This sample and hold circuit can comprise a further switch and capacitor per cell.

Figure 7:
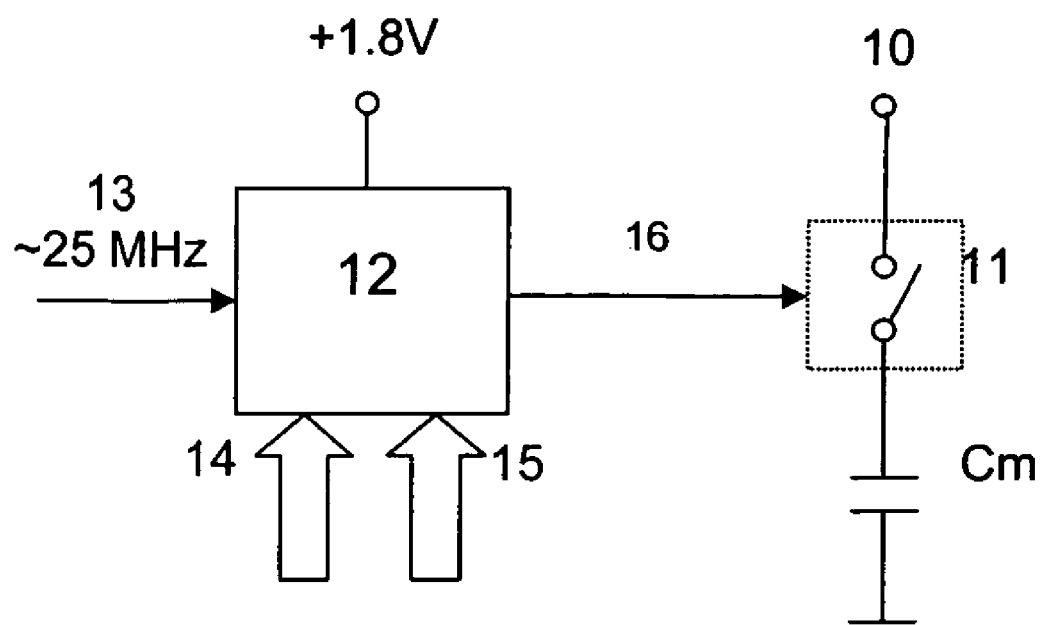
FIG. 7 depicts a time switching analog voltage programming circuit, according to one embodiment of the present invention.

FIG. 7 depicts a control circuit local to each element for deriving the required analog voltage from the single analog input, according to one embodiment of the present invention. Each element is connected to the single input 10 via a single analog switch 11. Voltage input 10 can be the equivalent of analog input 32 in FIG. 2. Capacitor Cm, the hold capacitance, is connected between switch 11 and ground. The voltage across capacitor Cm increases as the voltage on input 10 increases. The analog switch 11 is kept closed until the voltage on input 10 has reached the desired value. At this time switch 11 is opened, such that the voltage across capacitor Cm is held constant. Switch 11 in each cell within the array can be opened at different points, such that the voltage across each capacitor Cm varies from one cell to the next. The voltage across each capacitor Cm comprises the element control signal used to control that element.

The time at which switch 11 is opened is controlled by down counter 12. Down counter 12 has a power supply 17. The supply voltage is typically about 1.8V. Down counter 12 has three inputs: clock input 13, for example running at 25 MHz, address input 14 (the equivalent of address input 33 in FIG. 2) and digital signal input 15. Address input 14 can in fact comprise two or more address inputs, for example if the elements are arranged and addressed in rows and columns.

When address input 14 is selected the down converter receives a digital signal on input 15 corresponding to the required analog voltage for the cell. This digital signal is used to drive the down counter 12, such that after it has counted down at a rate driven by the clock input 13 from/to the value of the digital signal an output signal on line 16 is passed to switch 11 closing the switch. In this way, the voltage stored across capacitor Cm for each element can be individually controlled by the digital signal supplied on input 15 to each down counter.

As shown in FIG. 6, in one example once the voltage on input 10 has ramped up to its maximum value, instead of resetting to zero volts it can alternatively ramp back down to zero volts during the next programming period. For this option, the down counter 12 for each element needs to count down from a period of time equal to the maximum time period $T_{period}$ minus the value of the digital signal supplied on input 15.

Figure 8:
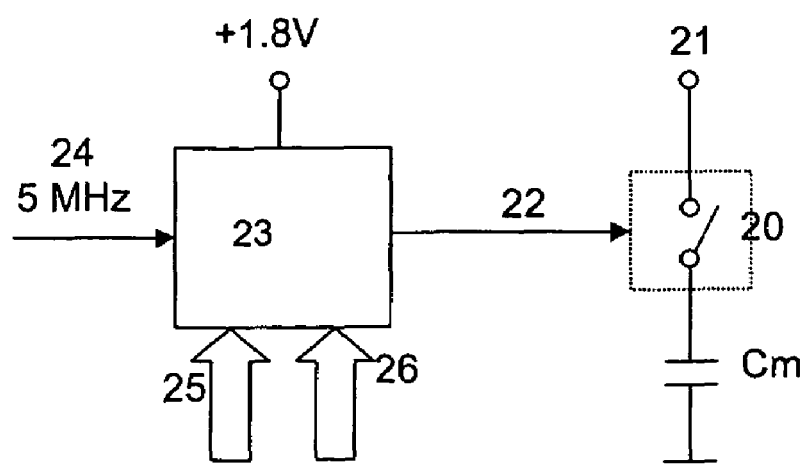
FIG. 8 depicts a pulse width modulation analog voltage programming circuit, according to one embodiment of the present invention.

FIG. 8 depicts a further embodiment of the present invention, in which the analog voltage supplied to each element within the array is determined by a single analog switch 20 driven by a pulse width modulated (PWM) signal. Analog switch 20 is connected to a DC voltage supply 21 (the equivalent of analog input 32 in FIG. 2) the DC voltage supply 21 could, for example, be about 10 V or about 25 V. Capacitor Cm is connected between switch 20 and ground. The voltage across capacitor Cm comprises the element control signal for the associated element. The PWM signal is supplied to switch 20 on line 22. The analog switch 20 is opened and closed in response to the PWM signal. When switch 20 is closed, capacitor Cm begins charging to the supply voltage. The variation in the duty cycle of the PWM signal (the ratio between the PWM signal being high and low) determines the voltage that is stored across capacitor Cm.

In one example, the PWM signal is produced by pulse width modulator 23. Pulse width modulator 23 has three inputs: a clock input 24, which could, for example, be running at about 5 MHz, an address input 25 (the equivalent of address input 33 in FIG. 2) and a digital signal input 26. Pulse width modulator 23 is powered by a power supply 27. The supply voltage is typically about 1.8 V. Address input 25 can in fact comprise two or more address inputs, for example if the elements are arranged and addressed in rows and columns. When address input 25 is selected the pulse width modulator 23 receives a digital signal on input 26 corresponding to the required analog voltage at the element. This digital signal is used to drive the pulse width modulator 23 such that the PWM signal output on line 22 has a duty cycle proportional to the digital signal on input 26. In this way, the voltage stored across capacitor Cm for each element can be individually controlled by the digital signal supplied on input 26 to each pulse width modulator 23.

With one and the same constant reference voltage supplied to every cell within the array and a single supplied clock frequency, the level of the output voltage can be varied by altering the duty cycle. It is unlikely that a sample and hold circuit would be required if the PWM signal is supplied continuously. The size of any ripple on the voltage across the capacitor Cm can be reduced by using a larger capacitor. If the clock frequency is much higher than the mechanical resonance frequency of the individually controllable element (for example, a controllable mirror element) then the element itself can act as a mechanical filter. A controllable mirror element typically has a mechanical resonance frequency of about 1 MHz. If the ripple is higher than this, then the mirror will be unable to follow the high frequency variations of the PWM output voltage and its position will therefore be defined by the average value of the output voltage.

Due to the limited reprogramming time available, for example about 10 µs, the control circuits illustrated in FIGS. 7 and 8 can be modified by incorporating a digital input latch in order to increase throughput. The digital input signal (15 in FIGS. 7 and 26 in FIG. 8) is arranged to receive a multiple bit digital signal, for example an 8-bit signal, corresponding to the desired voltage to be stored on capacitor Cm. By incorporating a digital latch on the digital signal input, for example an 8-bit latch, while the current digital signal is being used in the down counter or the pulse width modulator the next digital signal can be loaded into the latch. This reduces the amount of time required to load the digital signal into the down counter or the PWM at the start of each reprogramming cycle.

It will be appreciated that the circuits illustrated in FIGS. 7 and 8 can be regarded as local DAC circuits, each suitable for incorporation in a respective one of the cells of a programmable patterning device embodying the present invention. This is because each circuit is arranged to receive a digital control signal, and to generate a corresponding analog output control voltage, with reference to an analog input voltage (reference voltage) 21, 10.

Figure 9:
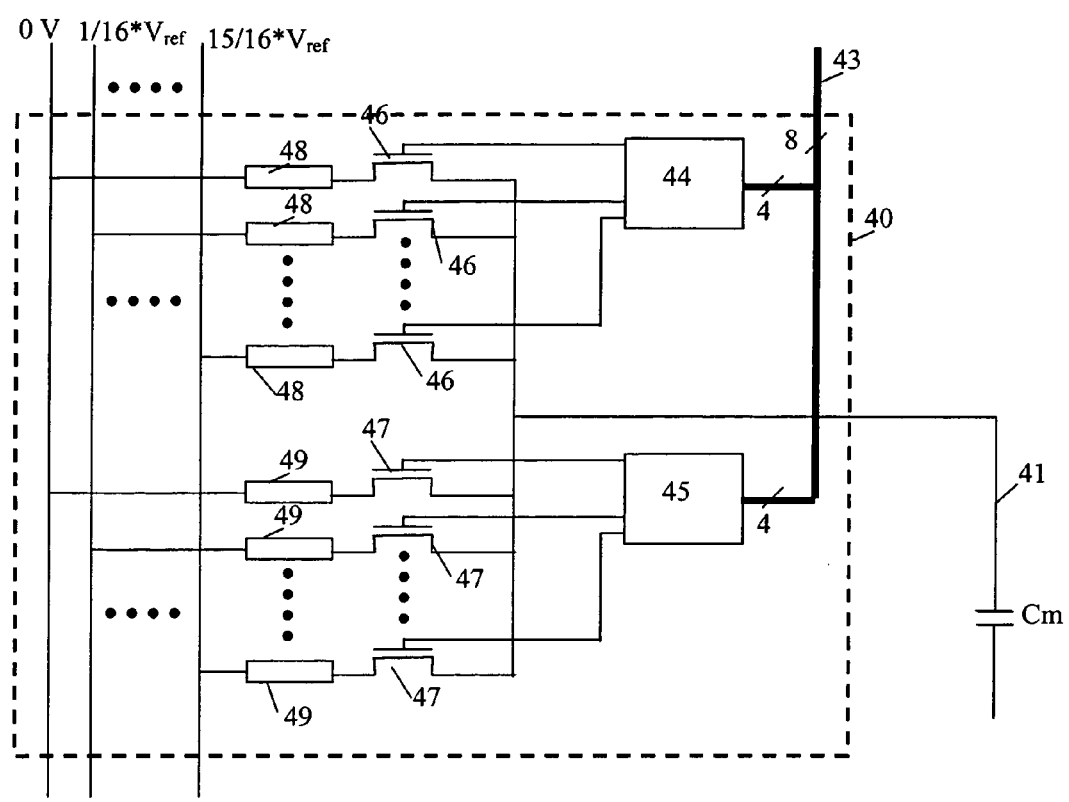
FIG. 9 depicts a digital to analog converter, according to one embodiment of the present invention.

FIG. 9 depicts a further embodiment of the present invention, in which there is provided an alternative form of DAC for driving an analog channel supplying analog voltage to elements within the array. Capacitor Cm corresponds to the capacitance of an element within the array. DAC 40 supplies an analog output signal to the array on transmission line 41.

Each capacitor Cm is charged up to the appropriate voltage. The energy stored in a charged capacitor is equal to $\frac{1}{2} \times C \times V^2$ where C is the capacitance and V is the voltage applied across the capacitor. Every capacitor in the array needs to be charged to its next voltage set point every update period.

In one example, a first option for improving the power dissipation within a DAC is to supply the DAC with all of the potential output voltages it could require, rather than the DAC generating each output voltage internally from a single voltage supply. During each update cycle the DAC can connect to each voltage supply in turn. When switching between successive voltage set points the energy dissipated in the switching is equal to $\frac{1}{2} \times C \times (\Delta V)^2$, where $\Delta V$ is the difference between two successive voltages. For ready comparison with a traditional DAC design the power dissipation can be expressed as the charge transferred multiplied by the voltage differential. The charge transfer is the same, however the voltage differential for a traditional amplifier is typically larger, up to the supply voltage, which can be up to about 30 V. For the circuit of FIG. 9 the voltage differential equates to the step size.

However, for an 8-bit digital signal, 256 reference voltages would be required, which is undesirable. If the accuracy of the digital signal is increased further the required number of reference voltages would quickly become unfeasible. As an alternative, the 8-bit digital signal supplied on digital input line 43 can be split into two 4-bit signals supplied to two 4-bit demultiplexers 44 and 45. Each 4-bit demultiplexer 44, 45 has 16 outputs connected to 16 switches 46 and 47 respectively. Each switch is connected, via a resistor, to a single reference voltage. The switches 46, 47 are arranged such that each reference voltage is connected to a single switch from each set of 16 switches. The switches are typically MOSFETs and are depicted as such.

For clarity, only three reference voltage lines and two sets of three switches are shown. The remaining 13 voltage lines, resistors and switches are indicated by the dots. The voltage supplied to each voltage reference input differs from the next reference by 1/16 of the full scale voltage $V_{ref}$. $V_{ref}$ can be 3 V. Each reference voltage input is capable of sinking 3 A. Thick copper wires provide a sufficiently low series resistance for the voltage reference inputs such that they do not affect the output signal on the transmission line 42.

By scaling the signal supplied by one of the sets of switches by a factor of 16, 256 different output levels can be arranged by adding the outputs of a number of switches together. All switches are depicted connected to the transmission line 42. Each switch is connected to its respective reference voltage by a resistor 48, 49. The resistance ratio between resistors 48 and 49 determines the scaling of the signals supplied by each set of switches. In one example, this ratio is an integer, and can be a power of two, e.g., 16. The resistance of resistors 49 is about 16 times larger than the resistance of resistors 48. The output signals from switches 46 (corresponding to the 4 most significant bits) will be about 16 times larger than that for the output signals from switches 47. Because the output resistance of the least significant bits (from switches 47) is about 16 times larger than the most significant bits little current can flow from one 4-bit DAC to the other. Therefore, there is little steady state power dissipation.

It one example, the output impedance of the whole DAC 40 should be of the order of 400Ω. This, from experience, has been found to provide for sufficiently fast damping of transmission line reflections and for fast settling time behavior. The settling time is dependent on the low pass filter, which is formed by the output resistance and the load capacitance Cm. Therefore, resistors 48 should be about 400Ω and resistors 49 should be about 6.4 kΩ.

The series resistance of each switch is not negligible and has to be accounted for. This adds to the total resistance for the output of each switch and resistor pair, and therefore can affect the mixing ratio for the outputs of switches 46 and 47 respectively. As well as using types of switches with the smallest possible series resistances, the switches are also matched in the same 1:16 resistance ratio as the resistors 48 and 49. This can be done geometrically by designing the length/width ratio of the channel regions for switches 46 and 47 to vary by a factor of 16.

The channel resistance of a MOSFET depends on the voltage across the channel. By arranging the switches and the resistors as shown with the resistors between the reference voltages and the switches, the channel voltages can be made approximately equal, thereby improving the matching.

In one example, power dissipation for DAC 40 is minimized as there is limited analog circuitry, and no internally generated reference voltages or active components. The digital circuitry runs at a low voltage level except for the gate drivers of the switches 46, 47.

In one example, the DAC 40 provides a current output range that can vary in 256 equal steps from zero to the maximum current. This current output charges capacitor Cm at each element. If required, the current output can be converted to a voltage output by arranging a resistor between the output of the DAC and earth in parallel to the capacitor Cm.

In one example, the settling time of the signal on the transmission line, for the signal to settle to within about 0.1% of the required value is equal to 7τ, where τ is derived from the step response from the low pass filter formed from the output resistance of the DAC 40 and the load capacitance Cm. The step response is $1-e^{(-t/\tau)}$. $\tau = R \times C$.

It will be readily apparent to a skilled artisan that where examples and/or embodiments of the present invention refer to the digital signal representing the required analog voltage at each element comprising an 8-bit signal, the digital signal can in fact be of any length. Where digital signals are described as being set high or low it will be readily appreciated that these arbitrary values can be reversed. It will also be appreciated that in examples and/or embodiments of the present invention, the patterns to be exposed can have been generated in a digital domain, and can then have to be converted into accurately defined states of all individually controllable elements of an array, with high enough update rate.

One of the steps in the conversion chain is the digital-to-voltage conversion. The array elements can be controlled physically with electrostatic force, which is related to a voltage level with a certain accuracy (e.g., 8 bit). For such a conversion, it is required to be able to generate an analog voltage with 256 distinguishable levels. One or more embodiments of the present invention aim to provide conversion techniques such that higher update rates can be achieved for lower power dissipation, and with lower complexity of the external and the on-chip drive electronics. One or more embodiments are also able to provide higher reliability, improved mechanical and electrical robustness, and at lower lowest cost.

In certain embodiments, the digital-to-analog(voltage) conversion is shifted as much as possible to the end of the conversion chain. In certain embodiments this is achieved by placing a DAC bellow every array element and working with low-voltage-level digital signals (giving lower power, better performance with respect to crosstalk, interference, etc.)

In other embodiments, to reduce the power dissipation and to lower the synchronization requirements for the analog signals, all array elements, which need to have one and the same state during the next exposure pattern, are updated simultaneously. This is desirable in embodiments in which we have a limited number of states, for example, 256 or 1024, and a much bigger number of array elements, for example up to about 10 million, or more. This technique can utilize a new on-chip CMOS architecture, and more specifically a new addressing algorithm.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus, comprising:
an illumination system that supplies a beam of radiation;
a controllable patterning device comprising an array of individually controllable elements that pattern the beam;
a control system that outputs a voltage signal and controls the patterning device;
a projection system that projects the patterned beam onto a target portion of a substrate; and
a supply channel coupled between the control system and the patterning device,
wherein,
the patterning device comprises a plurality of cells, each cell comprising a respective one of the individually controllable elements and a respective local control circuit controllable to generate a respective control voltage that determines a configuration of the respective controllable element,
the supply channel provides the voltage signal to each cell,
the control system provides control signals to the plurality of local control circuits,
each local control circuit comprises a charge collector including a logic device, a switching system and an integration circuit, and
each local control circuit is responsive to the control signals to generate the respective control voltage from the voltage signal.

2. The lithographic apparatus of claim 1, wherein:
the patterning device is divided into a plurality of groups of the cells; and
there are a plurality of the supply channels, each supply channel in the plurality of supply channels are arranged to provide the voltage signal to each cell in a respective group of the cells.

3. The lithographic apparatus of claim 1, wherein each of the respective control voltages comprises an analog voltage value.

4. The lithographic apparatus of claim 1, wherein the voltage signal comprises a series of different voltages, and each of the local control circuits comprise the respective integration circuit responsive to the control signals to generate the respective control voltage by integrating at least one selected respective voltage from the series.

5. The lithographic apparatus of claim 4, wherein each voltage within the series of different voltages is equal to a full-scale voltage divided by a number less than or equal to the number of bits in a digital signal corresponding to a desired control voltage for each of the cells.

6. The lithographic apparatus of claim 4, wherein the control signals comprise a digital address input arranged to be high for a respective one of the cells when the voltage signal is at a voltage level corresponding to a bit position which is high in the digital signal for the respective cell.

7. The lithographic apparatus of claim 1, wherein:
the integration circuits in each of the local control circuits comprise,
a first capacitor having first and second terminals;
an operational amplifier having first and second inputs and an output, the second input being connected to ground;
a second capacitor connected between the first input and the output of the operational amplifier; and
the switching system in each of the local circuits comprise,
a first controllable switching device connecting the respective local circuit to the supply channel, and
a second controllable switching device having a select position in which the second terminal of the first capacitor is connected to ground and a deselect position in which the second terminal of the first capacitor is connected to the first input of the operational amplifier;
the first controllable switching device having a select position in which the first terminal of the first capacitor is connected to the voltage signal and a deselect position in which the first terminal of the first capacitor is connected to ground;
each local control circuit being arranged such that the operation of the first and second controllable switching devices is controlled by the digital address input wherein,
when the digital address input is high the controllable switching devices are in the select position and the first capacitor is charged to the voltage of the voltage signal;
when the digital address input is low the controllable switching devices are in the deselect position and the charge stored on the first capacitor is transferred to the second capacitor, and
after each series of different voltages of the voltage signal the voltage on the output of the charge amplifier comprises the control voltage for the respective controllable element.

8. The lithographic apparatus of claim 7, wherein each of the local control circuits further comprise:
a third controllable switching device arranged electrically in parallel to the second capacitor and controlled by a reset signal, such that closing the third controllable switching device when the first and second controllable switching devices are in the deselect position any charge stored on the capacitors is substantially reduced to zero and the control voltage is substantially reduced to zero volts.

9. The lithographic apparatus of claim 7, wherein each local control circuit further comprises:
a third capacitor having a first terminal and a second terminal connected to ground; and
a fourth controllable switching device connected between the output of the operational amplifier and the first terminal of the third capacitor;
wherein the fourth controllable switching device can be selectively closed to charge the third capacitor to the output voltage of the operational amplifier, the voltage across the third capacitor comprising the control voltage for the respective controllable element for that cell.

10. The lithographic apparatus of claim 9, wherein the third capacitor comprises an input capacitance of the respective controllable element.

11. The lithographic apparatus of claim 1, wherein the control signals comprise:
a digital address input; and
a digital signal corresponding to a desired control voltage for each cell, each local control circuit receiving a respective one of the digital signal in response to the digital address input.

12. The lithographic apparatus of claim 11, wherein:
the switching system is connected between the supply channel and ground via a fourth capacitor, the switching system being controlled by an intermediate control signal; and
the voltage across the fourth capacitor comprises the control voltage for the respective controllable element.

13. The lithographic apparatus of claim 12, wherein the fourth capacitor comprises the input capacitance of the respective controllable element.

14. The lithographic apparatus of claim 11, wherein:
the voltage signal comprises a voltage whose magnitude changes progressively over a predetermined time period; and
each one of the local control circuits is responsive to the control signals to determine the respective control voltage by controlling a timing of operation of the switching system during the predetermined time period.

15. The lithographic apparatus of claim 14, wherein the plurality of respective further electronic components in each of the local control circuits comprise:
a down counter that receives the digital signal, waits a period of time according to the value of the digital signal from the start of the predetermined time period, and then opens a switch in the switching system.

16. The lithographic apparatus of claim 15, wherein the switch is closed from the start of the predetermined time period.

17. The lithographic apparatus of claim 11, wherein:
the voltage signal comprises a voltage of substantially constant magnitude;
each of the local control circuits comprises a respective (pulse width modulation) PWM signal generator arranged to generate a PWM control signal to control the switching system; and
the control signals from the control system are arranged to determine a duty cycle of each PWM control signal.

18. The lithographic apparatus of claim 1, wherein the respective charge collectors are configured to receive address signals, reset signals, and the control signals to generate the respective control voltages.

19. A device manufacturing method, comprising:
providing a patterning device having a plurality of individually controllable elements using a plurality of cells, each cell in the plurality of cells comprising a respective one of the individually controllable elements and a respective local control circuit;
providing each of the local control circuits with a respective charge collector including a logic device, a switching system, and integration circuit;
generating a respective control voltage with each of the local control circuits;
using the respective control voltage to determine a configuration of the respective controllable element;
providing a voltage signal to each of the cells;
providing control signals to the plurality of local control circuits; and
each of the local control circuits generating the respective control voltage from the voltage signal in response to the control signals;
using the controllable patterning device to pattern a beam of radiation; and
projecting the patterned beam of radiation onto a target portion of a substrate.

20. The method of claim 19, wherein:
the voltage signal is formed from a series of different voltages; and
the respective control voltage is generated by integrating at least one selected respective voltage from the series in response to the control signals.

21. The method of claim 19, wherein:
the voltage signal comprises a voltage whose magnitude is changed progressively over a predetermined time period; and
the respective control voltage is determined by controlling a timing of operation of the respective switching system in response to the control signals during the predetermined time period.

22. The method of claim 19, wherein:
the voltage signal comprises a voltage of substantially constant magnitude;
each of the local control circuits comprise a respective pulse width modulation (PWM) signal generator that generates a PWM control signal to control the respective switching system; and
a duty cycle of each PWM control signal is determined in response to the control signals from the control system.

23. A device manufacturing method, comprising:
using the controllable patterning device comprising an array of individually controllable elements to pattern a beam of radiation;
projecting the patterned beam onto a target portion of a substrate; and
using a control system to generate respective control voltages, which determine a configuration of respective ones of the controllable elements, the using step comprising,
sequentially receiving multiple bit digital signals corresponding to the respective control voltages at the control system;
splitting the digital signals into at least two shorter digital signals;
supplying each shorter digital signal to a respective demultiplexer in a plurality of demultiplexers;
controlling a plurality of switches connected to a plurality of voltage input lines using the respective demultiplexer,
controlling outputs of a first group of the switches controlled by a first demultiplexer in the plurality of demultiplexers, such that the outputs are scaled with respect to the outputs of another group of the switches;
connecting all of the outputs together to form the control voltages; and
supplying the control voltages to the array of individually controllable elements.

24. The method of claim 23, wherein each switch is connected to its respective voltage input line via a resistor, the resistors connected to the first group of switches being larger than the resistors connected to the other set of switches.

25. A controllable patterning device comprising an array of individually controllable elements that pattern a beam of radiation, wherein the patterning device comprises:
a plurality of cells, each cell comprising,
a respective one of the individually controllable elements, and
a respective local control circuit that generates a respective control voltage, which determines a configuration of the respective controllable element, each of the local control circuits comprising a charge collector comprising,
a logic device;
an integration circuit,
a first respective controllable switching device coupled between the logic device and the integration circuit, and which connects the integration circuit to a supply channel to provide a voltage signal to each cell, and a plurality of respective further electronic components, each of the local control circuits receiving control signals and generating the respective control voltage from the voltage signal.

* * * * *

UNITED STATES PATENT AND TRADEMARK OFFICE
CERTIFICATE OF CORRECTION

| | |
|---|---|
| PATENT NO. | : 7,321,416 B2 |
| APPLICATION NO. | : 11/152849 |
| DATED | : January 22, 2008 |
| INVENTOR(S) | : Reijnen et al. |

It is certified that error appears in the above-identified patent and that said Letters Patent is hereby corrected as shown below:

Title Page, Item (57), Abstract section "manufacturing method method that uses" should be replaced with --manufacturing method that uses--.

Signed and Sealed this

Thirteenth Day of May, 2008

JON W. DUDAS
*Director of the United States Patent and Trademark Office*